United States Patent [19]
Pierce, deceased et al.

[11] Patent Number: 5,179,575

[45] Date of Patent: Jan. 12, 1993

[54] TRACKING ALGORITHM FOR EQUALIZERS FOLLOWING VARIABLE GAIN CIRCUITRY

[75] Inventors: John N. Pierce, deceased, late of Lexington, by Alice M. Pierce, executrix; by George R. Letteney, executor, Boston, both of Mass., Boston Safe Deposit & Trust Co., executor

[73] Assignee: Sundstrand Corporation, Rockford, Ill.

[21] Appl. No.: 504,392

[22] Filed: Apr. 4, 1990

[51] Int. Cl.$^5$ .................. H03H 7/30; H03H 7/40; H04L 1/02
[52] U.S. Cl. .................................. 375/14; 375/100; 455/137
[58] Field of Search ............... 375/14, 40, 96, 99, 375/100, 101, 102, 103, 15; 364/724.11, 724.19, 724.2; 455/137, 138

[56] References Cited

U.S. PATENT DOCUMENTS

| | | | |
|---|---|---|---|
| 3,879,664 | 4/1975 | Monsen | 375/100 X |
| 4,112,370 | 9/1978 | Monsen | 375/100 X |
| 4,271,525 | 6/1981 | Watanabe | 375/14 |
| 4,328,585 | 5/1982 | Monsen | 375/14 |
| 4,718,073 | 1/1988 | Takaoka | 375/14 |
| 4,747,068 | 5/1988 | Voorman et al. | 375/14 X |

Primary Examiner—Stephen Chin
Assistant Examiner—Tesfaldet Bocure
Attorney, Agent, or Firm—Dike, Bronstein, Roberts & Cushman

[57] ABSTRACT

A receiver for processing signals transmitted through a dispersive medium which receiver provides received signals at a plurality of diversity channels and uses adaptive equalizer circuitry for providing an adaptive weighted equalizer output signal. An error signal is derived at an error circuit in response to the equalizer output signal and to a reference signal, the error signal being correlated at a correlator with the adaptive weighting signals at each weighting section of the adaptive equalizer circuitry to generate weighting factors for use in such weighting sections. Scale factor circuitry responds to a signal having an amplitude which is a reliable estimate of the amplitude of the adaptive equalizer output signal and to the reference signal to provide a scale factor by which the reference signal is multiplied at a multiplier prior to its use in deriving the error signal.

10 Claims, 3 Drawing Sheets

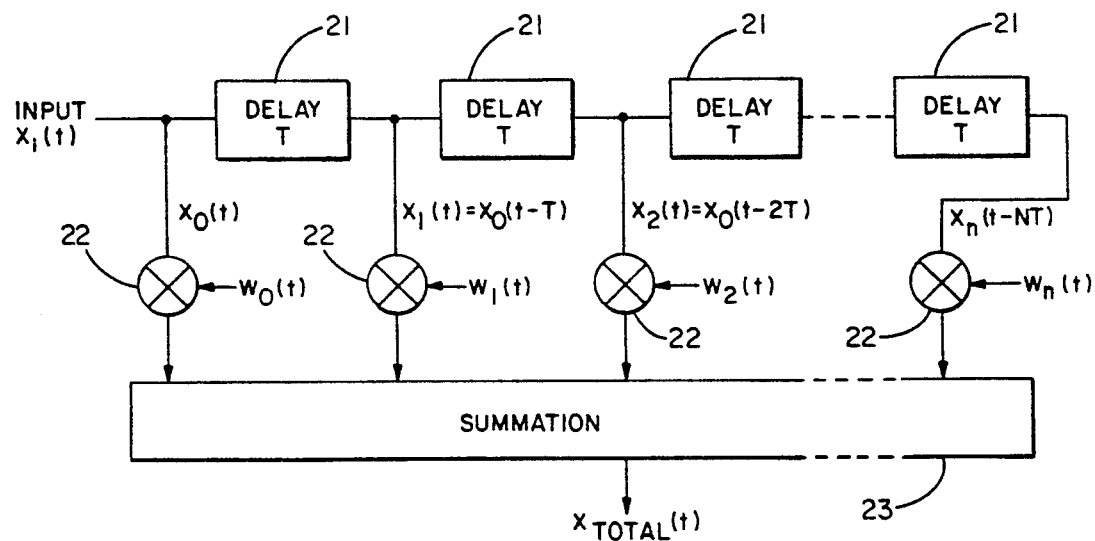
FIG. 3
PRIOR ART
FIG. 4
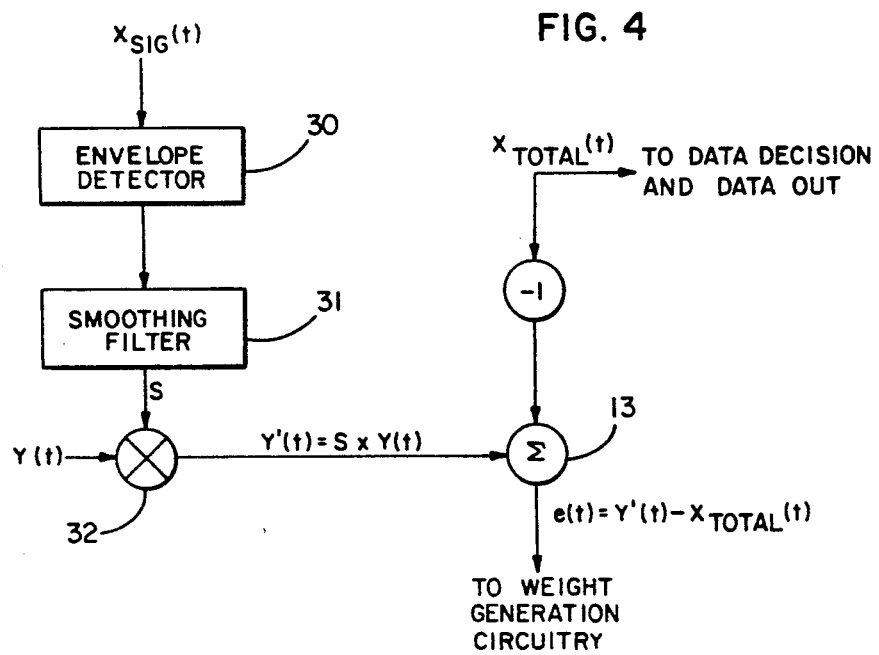

TRACKING ALGORITHM FOR EQUALIZERS FOLLOWING VARIABLE GAIN CIRCUITRY

INTRODUCTION

This invention relates generally to receiver systems using adaptive equalizer circuitry and, more particularly, to techniques for preventing rapid signal level fluctuations at the input of an adaptive equalizer circuit from adversely affecting the operation thereof.

BACKGROUND OF THE INVENTION

Digital diversity communication systems make use of adaptive equalization techniques in order to remove as efficiently as possible intersymbol interference and to avoid, or at least considerably reduce, the possibility of errors due to the presence of noise. A typical adaptive receiver system using equalizer circuitry, as in the form of an adaptive transversal filter circuit, sometimes referred to as a tapped-delay line equalizer circuit, is discussed, for example, in U.S. Pat. No. 3,879,664 entitled "High Speed Digital Communications Receiver", issued to P. Monsen on Apr. 22, 1975. In such a system, adaptive weights $W_0 \ldots W_n$ are used at each of the delay line taps, the weights being selected so that intersymbol interference is markedly reduced, while at the same time increasing the noise level as little as possible.

The general theory of the operation of such circuitry is now well-known to the art. Thus, the operation thereof requires that some values of the polarity of the transmitted signal be known to the receiver, which values are used as a "reference" signal. In one case, for example, such polarity values are provided by inserting identifiable pulses of known polarity in the transmitted data stream, in which case the equalization circuit is often designated as a "transmitted reference" equalizer. In another exemplary case it is possible to assume that nearly all of the received pulses out of the equalizer circuit have the correct polarity and these output polarities are used in the calculation of the weights. Such an equalization circuitry is often referred to as a "decision-directed" equalizer.

An error signal occurs when the output of the equalization circuit differs from the reference signal, the weight values used in such case in the equalizer circuitry being incorrect. A feedback circuit responsive to the error causes the weight values to be appropriately changed so as to reduce the error. One of the problems in achieving adequate performance of the equalizer circuit occurs when there are relatively rapid fluctuations in the intersymbol interference level, in effect producing fluctuations in the input to the equalizer circuit. Such fluctuations are often caused by imperfect operation of the automatic gain control (AGC) circuitry used in the receiver system or by other pre-processing of the received signal, one example of which is the use of adaptive matched filter technology used with the equalizer circuitry. If the time constant of the overall feedback path is too long, the circuit can not track such rapid fluctuations in input level in a manner well enough to achieve the desired weight values required so that leakage of intersymbol interference occurs. On the other hand, if the time constant is too short, there will be excessive noise fluctuations of the weight values about their desired values, thereby also causing undesired leakage of intersymbol interference.

It is normally more effective to use a time constant that is sufficiently long that excessive noise fluctuations do not occur in the computed weight values. Such operation, however, may in some cases fail to track signal input level fluctuations well enough to assure that the correct weights are achieved when rapid input level fluctuations occur.

It is desirable, therefore, to devise an appropriate technique which will better assure that the weight values which are computed for use in the equalizer circuit are substantially correct even when rapid fluctuations in the input levels to the equalizer circuit occur, while at the same time providing operation which does not appreciably increase the noise level effects in the equalizer operation.

BRIEF SUMMARY OF THE INVENTION

In accordance with the invention, the reference signal which is used in determining the error signal for computing the desired weight values is multiplied by a scale factor which is derived from a signal having an amplitude which is a reliable estimate of the amplitude of the desired adaptively weighted equalizer output signal. The signal having such estimated amplitude may be obtained by matched filtering, diversity combining, or by other means. Thus, for example, the scale factor may be derived from the summed output of equalizer circuits, when a plurality of such equalizer circuits are used, or it may be derived from the output of adaptive matched filter circuitry, or a signal equivalent thereto, when a single equalizer circuit is used following such adaptive matched filter circuitry. The technique used to derive such scale factor includes a means for determining the absolute value of the signal to which it responds, e.g., an envelope detection circuit, and a means for smoothing the fluctuations in such absolute value, e.g. an appropriate smoothing filter. The output of the smoothing filter provides a scale factor value which in effect is the average of the absolute value of the fluctuating input signal, which average value is used to multiply the reference signal, i.e. to scale the level of such reference signal upward or downward, before it is used in determining the error signal used in generating the desired weight values.

DESCRIPTION OF THE INVENTION

The invention can be described in more detail with the help of the accompanying drawings wherein.

FIG. 3 shows a block diagram of a typical tapped delay line adaptive qualizer circuit of the prior art;

FIG. 4 shows a block diagram of circuitry of the invention for use in improving the operation of the receivers shown in FIG. 1;

Figure 1:
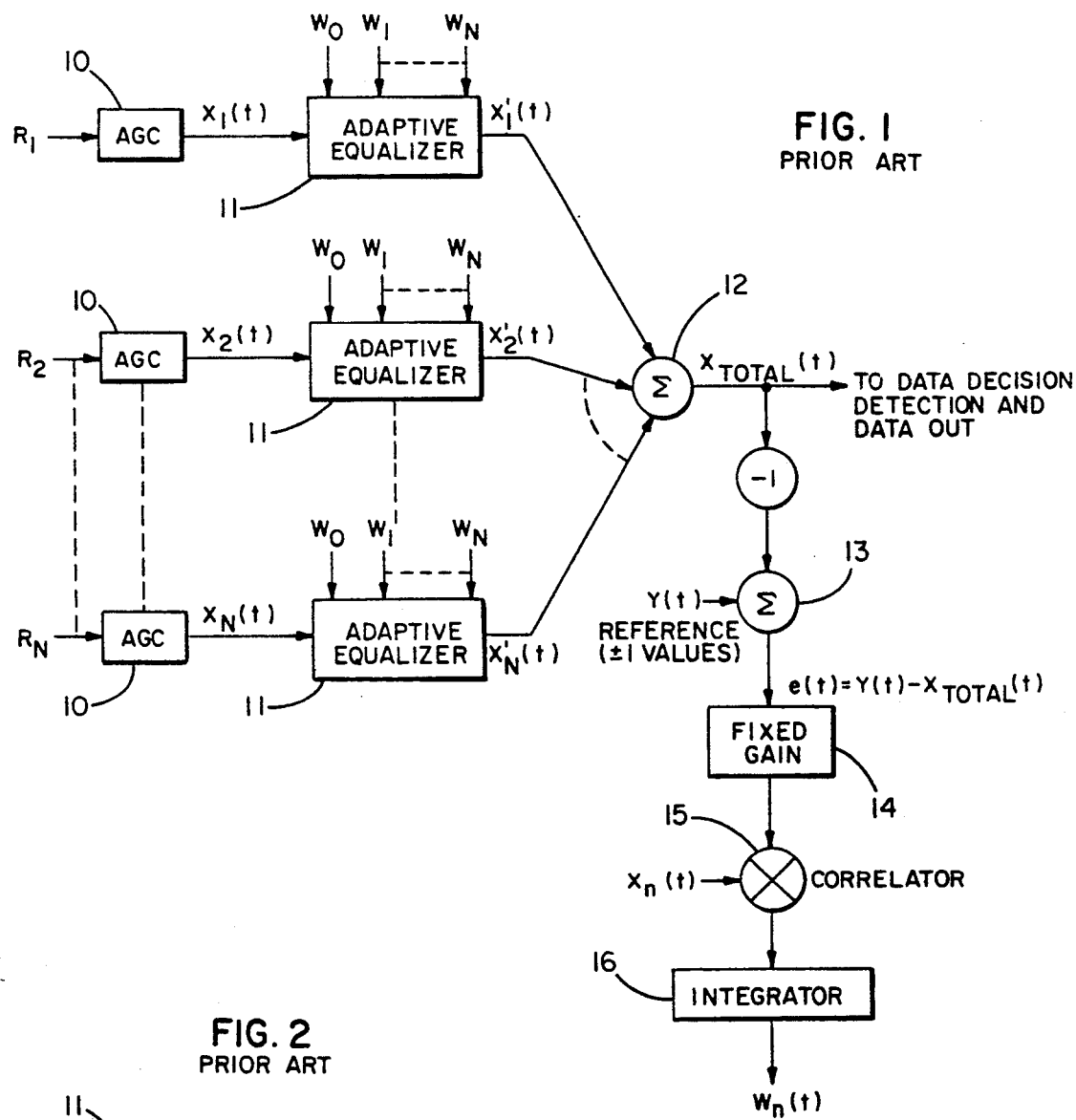
FIG. 1 shows a block diagram of one typical embodiment of a receiver of the prior art which uses adaptive equalizer circuitry.

As can be seen in a typical prior art system in FIG. 1, for example, a typical digital N-diversity channel receiver is shown in which diversity signals R1, R2 ... RN are received in each diversity channel at automatic gain control (AGC) circuits 10 to provide substantially constant input signals $X_1(t), X_2(t) \ldots X_N(t)$ to each of a plurality of adaptive equalizer circuits 11. The outputs $X'_1(t), X'_2(t)$ in $X'_n(t)$ from the equalizer circuits are then combined in a summation circuit 12 to produce an adaptive equalizer output signal $X_{TOTAL}(t)$ which is supplied to data output circuitry (not specifically shown) as would be well known in the art.

The negative of the output signal $X_{TOTAL}(t)$ is compared with, i.e. in effect subtracted from, a reference signal $Y(t)$ at summation circuit 13 to produce an error signal $e(t)$ which is amplified, for example, by a fixed gain amplifier 14 and correlated with the signals $X_n(t)$ at each of the n taps of an adaptive equalizer circuit which circuit is in the form, for example, of a n-tapped delay line adaptive transversal filter, as discussed below. The output of correlation circuit 15 is suitably smoothed, as by an integrator circuit 16, to provide the corresponding weight value $W_n(t)$.

A typical n-tapped delay line adaptive equalizer circuit is shown in FIG. 3, the input $X_i(t)$ thereto being supplied to a tapped delay line 20 having a series of delays 21 to provide tap signals $X_0(t), X_1(t-T), X_2(t-2T) \ldots X_n(t-nT)$ where T is 1 delay unit. The tap signals are multiplied by corresponding weight signals $W_0, W_1 \ldots W_n$ at multipliers 22 and the weighted signals are combined at summation circuit 23 to produce the output of the equalizer circuit $X'(t)$.

If a plurality of adaptive equalizers are used, as shown in FIG. 1, the outputs of each equalizer circuits $X'_1, X'_2 \ldots X'_n$ are in turn summed at summation circuit 12, as would be well known to the art, to produce the adaptive equalizer circuitry output signal $X_{TOTAL}(t)$.

Figure 2:
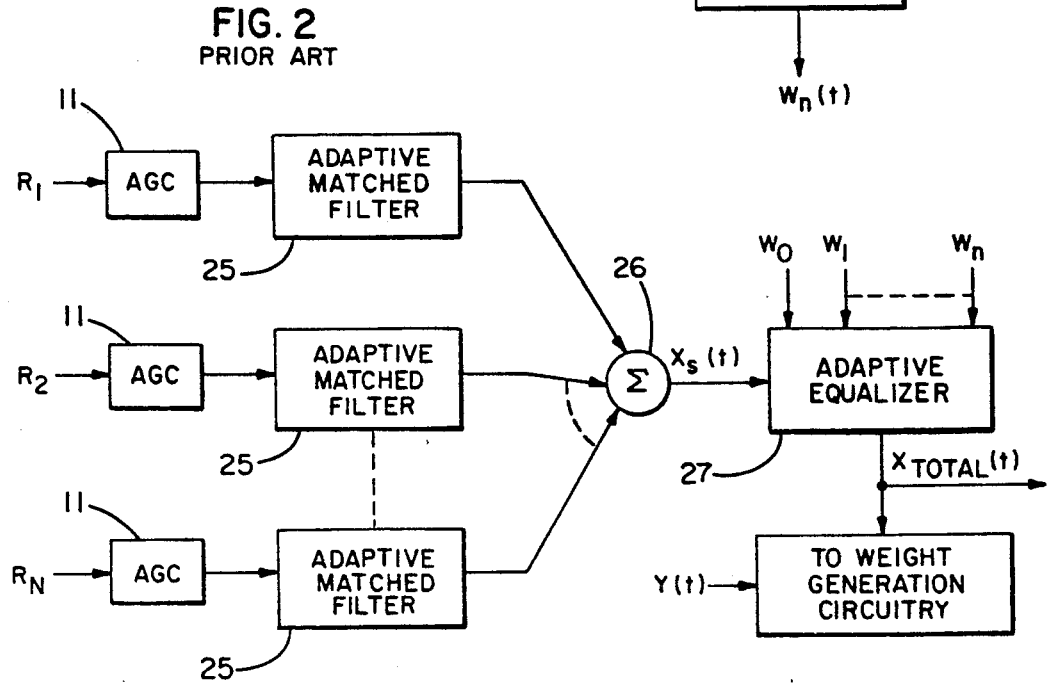
FIG. 2 shows a block diagram of another typical embodiment of a receiver of the prior art which uses adaptive equalizer circuitry.

If the signals from AGC circuits 11 are instead supplied first to a plurality of adaptive matched filters, such as shown by filters 25 in FIG. 2, the outputs thereof can be summed at summation circuit 26 and the output signal $X_S(t)$ thereof can in turn be supplied to a single adaptive equalizer circuit 27, again of the type shown in FIG. 3, for example, to produce the final output signal $X_{TOTAL}(t)$ for use in supplying to the data output. Such output is also used in determining the desired weight values in weight generation circuitry 28 for the tapped delay line of the single adaptive equalizer circuit 27, in the same manner as shown in FIG. 1.

While the configurations depicted in FIGS. 1, 2 and 3 and the operations thereof are well known to those in the art, they are helpful in understanding the invention here. In each case, if there are relatively rapid gain fluctuations of the signals at the inputs to the adaptive equalizer circuits, such circuits may not operate well enough to assure that the weight values which are generated for use therein are correct. In accordance with the invention, the generation of such weight values is arranged so as to substantially remove the adverse effects of such rapid gain fluctuations as may occur at the input to an adaptive equalizer circuit in the manner shown in FIG. 4, for example.

As seen therein, the reference signal $Y(t)$ normally used in the weight generation circuitry is multiplied by a scale factor S to provide an adjusted or scaled reference signal $Y'(t)$ which equals $S \times Y(t)$. The scale factor is derived from a signal the amplitude of which is a reliable estimate of the desired signal amplitude. For example, in order to compute the scale factor S, in the embodiment shown, a signal, which is one whose amplitude is a reliable estimate of the amplitude of the desired signal, is supplied to a suitable circuit means, such as an envelope detector 30, which produces a detected signal which represents the varying amplitude (having a positive polarity) of the absolute value of $X_{SIG}(t)$. Such signal is suitably smoothed, or filtered, by using an appropriate smoothing filter 31 to produce the scale factor S, which effectively represents a slowly varying average amplitude of the rapid level fluctuations in $X_{SIG}(t)$.

The scale factor S is used to multiply the reference signal $Y(t)$, as at a multiplier 32, to provide the scaled reference signal $Y'(t)$, which is then used as the reference signal for computing the error signal $e(t)$. The error signal then effectively also varies as the average value of the level of the fluctuations of the signal at the equalizer and is used to correlate with each of the tapped delay signals $X_n(t)$ to generate in effect compensated weight values, i.e., weight values which compensate for the rapid fluctuations in the input to the equalizer circuitry.

The technique discussed with reference to FIG. 4 can be used in a system of FIG. 1, for example, by scaling the, normally used reference signal $Y(t)$ using the $X_{TOTAL}(t)$ signal at the output of summation circuit 12 as the signal, $X_{SIG}(t)$, for such scale factor calculation. The error signal, determined therefrom is then correlated with each of the tap signals of each of the equalizers 11 to generate the desired compensated weight values $W_o \ldots W_n$ for each equalizer circuit.

Figure 5:
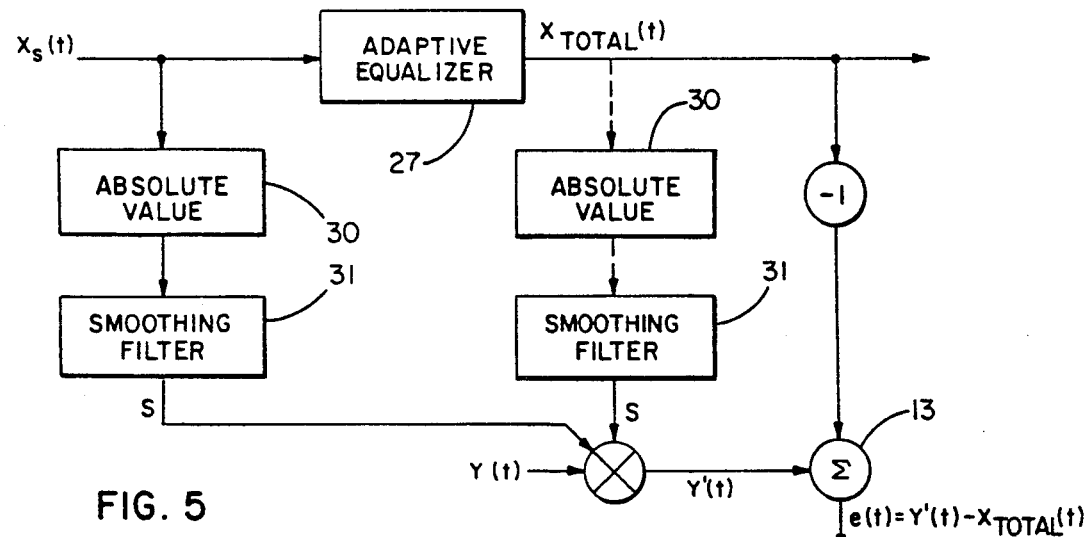
FIG. 5 shows a block diagram of circuitry of the invention for use in improving the operation of the receiver shown in FIG. 2.
Figure 6:
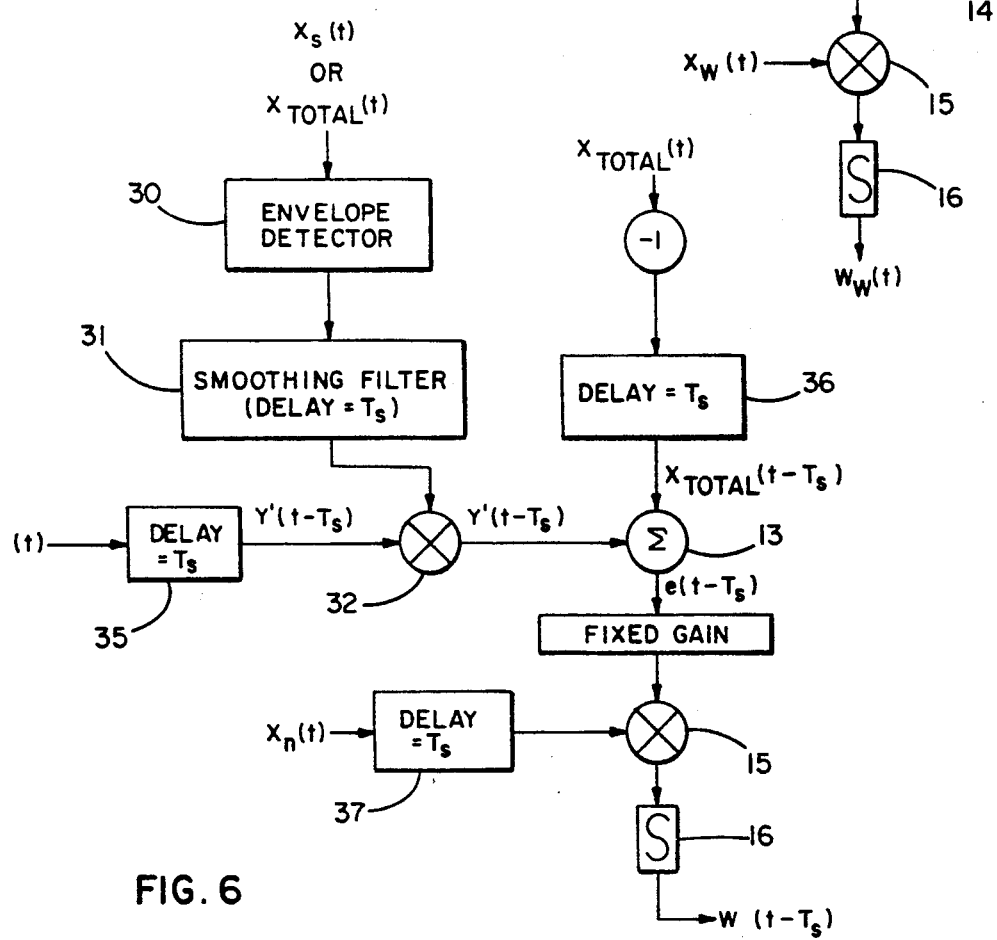
FIG. 6 shows a block diagram of further circuitry for use in improving the operation of the invention shown in FIGS. 4 and 5.

The technique described in FIG. 4 can also be used in the embodiment depicted in FIG. 2, as shown in FIG. 5, wherein the summed output $X_S(t)$ from the adaptive matched filters 25 is used to determine the scale factor S for scaling the reference signal and using such scaled reference in the weight generation circuitry for computing the weight values for each of the taps $W_o \ldots W_n$ of equalizer circuit 27. With reference to the system shown of FIG. 2, the scale factor S can also be obtained in an alternate manner (see dashed lines) in response to the output signal $X_{TOTAL}(t)$ from the equalizer circuit 27, such output signal also being a signal having a reliable estimate of the amplitude of the desired signal.

In any case, with reference to the diagram of FIG. 4 for use with the systems of FIGS. 1-3, the scale factor circuitry effectively senses the variations in average amplitude level of the signal to which it responds by obtaining the absolute value thereof, smoothing such value and using the smoothed value to scale the reference signal upwardly or downwardly so that it has in effect the same average amplitude level as the equalized signal. In this way the weight generating circuitry is not led to sense an apparent error when only the level of the equalized signal is fluctuating so that there is no attempt to make needless adjustments in the weight values due to such level fluctuations.

As a further refinement to the techniques described, it may be further desirable to compensate for the time delay which occurs in the smoothing filter 31 (FIG. 4) which is used in the averaging technique for generating the required scale factor. Such delay compensation can be accomplished as shown in FIG. 5, wherein the signals $Y'(t)$, $X_{TOTAL}(t)$, and $X_n(t)$ are delayed by a time-delay value equal to the delay $T_s$ in the smoothing filter 31. Such delay can be used in time-delay circuit 35 for delaying the signal $Y(t)$, in delay circuit 36 for delaying the signal $X_{TOTAL}(t)$, and in delay circuit 37 for delaying the signal $X_n(t)$. By inserting such delays, all of the signals involved can be brought into effective synchronism before computing the error and determining the required weighting values. Such an approach is relatively easy to implement when digital operation is used, such time-delays merely requiring extra time shifts of the digital signals involved.

While the above description discloses various embodiments of the invention, modifications thereto may occur to those in the art within the spirit and scope of the invention. Hence, the invention is not to be construed as limited to the specific embodiments described, except as defined by the appended claims.

What is claimed is:

1. A receiver for processing signals transmitted through a dispersive medium and received at a plurality of diversity channels, said receiver comprising receiving means responsive to the transmitted signals received from said dispersive medium for providing received signals at each said diversity channel;

adaptive equalizer circuitry responsive to said received signals for providing a combined adaptively weighted equalizer output signal, said equalizer circuitry including a plurality of weighting sections responsive to time delayed received signals and to a plurality of adaptive weighting factors for providing a plurality of adaptive weighted signals; and means for combining said plurality of adaptive weighted signals to provide said combined adaptively weighted equalizer output signal;

means for deriving an error signal in response to said combined adaptively weighted equalizer output signal and to an adjusted reference signal;

means responsive to said error signal and to the adaptive weighted signals at each weighting section of said adaptive equalizer circuitry for generating said plurality of weighting factors for use in said weighting sections to provide said plurality of adaptive weighted signals;

means responsive to a signal from said adaptive equalizer circuitry, said signal having an amplitude which is an estimate of the amplitude of said adaptively weighted equalizer output signal, for generating a scale factor; and means responsive to a non-adjusted reference signal and to said scale factor for providing said adjusted reference signal which is adjusted by said scale factor for use in deriving said error signal.

2. A receiver in accordance with claim 1 wherein said adjusted reference signal providing means includes means for multiplying said reference signal by said scale factor to produce said adjusted reference signal.

3. A receiver in accordance with claim 1 wherein said scale factor generating means includes first means responsive to the signal having said estimated amplitude for producing a varying signal level representing an average of the absolute value of fluctuations in said estimated amplitude signal; and second means responsive to said varying signal level for smoothing the varying signal level to produce said scale factor.

4. A receiver in accordance with claim 3 wherein said first means is an envelope detection circuit and said second means is a smoothing filter.

5. A receiver in accordance with claim 1 wherein said adaptive equalizer circuitry includes a plurality of adaptive equalizer circuits, each corresponding to one of said diversity channels; and means for combining the outputs of said plurality of adaptive equalizer circuits for providing said combined adaptively weighted equalizer output signal; and said adjusted reference signal providing means is responsive to said combined adaptively weighted equalizer output signal.

6. A receiver in accordance with claim 1 wherein said adaptive equalizer circuitry includes a plurality of adaptive matched filter circuits responsive to said plurality of received signals for providing a plurality of matched filtered signals;

means for combining said plurality of matched filtered signals for providing a combined matched filtered signal; and an adaptive equalizer circuit responsive to said matched filtered signal for providing said combined adaptively weighted output equalizer signal.

7. A receiver in accordance with claim 6 wherein said adjusted reference signal providing means is responsive to said combined adaptively weighted equalizer output signal.

8. A receiver in accordance with claim 6 wherein said adjusted reference signal providing means is responsive to said combined matched filtered signal.

9. A receiver in accordance with claim 4 wherein said smoothing filter has a time delay of $T_S$ and said receiver further includes means for providing said adjusted reference signal with a time delay substantially equal to $T_S$; and means for providing said combined adaptively weighted equalizer output signal with a time delay equal to $T_S$ when using said signal to derive said error signal.

10. A receiver in accordance with claim 9 wherein the means for generating said adaptive weighting factors includes means for correlating said error signal with the adaptive weighted signals at each weighting sections of said adaptive equalizer circuitry to generate said adaptive weighting factors; and means for providing the weighted signals at each weighting section of said adaptive equalizer circuitry with a time delay substantially equal to $T_S$ for use in said correlating means.

* * * * *